United States Patent
Lee

(10) Patent No.: US 10,311,948 B2
(45) Date of Patent: Jun. 4, 2019

(54) PHASE CHANGEABLE MEMORY DEVICE HAVING A CROSS POINT ARRAY STRUCTURE

(71) Applicant: SK hynix Inc., Icheon-si, Gyeonggi-do (KR)

(72) Inventor: In Soo Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/805,407

(22) Filed: Nov. 7, 2017

(65) Prior Publication Data

US 2018/0130527 A1 May 10, 2018

(30) Foreign Application Priority Data

Nov. 8, 2016 (KR) ......................... 10-2016-0148398

(51) Int. Cl.
 *G11C 11/00* (2006.01)
 *G11C 16/04* (2006.01)
 *G11C 13/00* (2006.01)
 *H01L 45/00* (2006.01)
 *H01L 27/24* (2006.01)

(52) U.S. Cl.
 CPC ...... *G11C 13/0004* (2013.01); *H01L 27/2427* (2013.01); *H01L 45/06* (2013.01); *H01L 45/1253* (2013.01); *H01L 45/141* (2013.01); *H01L 45/144* (2013.01); *G11C 13/004* (2013.01); *G11C 13/0069* (2013.01); *G11C 2213/76* (2013.01); *H01L 27/2463* (2013.01); *H01L 45/126* (2013.01)

(58) Field of Classification Search
 CPC .............. G11C 13/0004; G11C 13/004; G11C 13/0069; H01L 27/2463; H01L 45/1253; H01L 45/06; H01L 45/141; H01L 45/126
 See application file for complete search history.

(56) References Cited

U.S. PATENT DOCUMENTS

| | | | |
|---|---|---|---|
| 9,019,754 B1 * | 4/2015 | Bedeschi | G11C 13/004 365/148 |
| 2006/0056251 A1 * | 3/2006 | Parkinson | G11C 13/0004 365/202 |
| 2008/0272807 A1 * | 11/2008 | Lowrey | H03K 19/1733 326/93 |
| 2009/0225594 A1 * | 9/2009 | Choi | G11C 8/10 365/185.03 |
| 2013/0077383 A1 * | 3/2013 | Huang | G11C 13/0004 365/148 |
| 2014/0063888 A1 * | 3/2014 | Lee | G11C 5/025 365/63 |
| 2016/0099049 A1 | 4/2016 | Lee et al. | |

* cited by examiner

*Primary Examiner* — Ajay Ojha
(74) *Attorney, Agent, or Firm* — William Park & Associates Ltd.

(57) ABSTRACT

A phase changeable memory device may include a plurality of word lines, a plurality of bit lines, a memory cell, at least one source line, and a discharge unit. The bit lines may cross the word lines. The memory cell may include access elements connected with the at least one source line. The source line may be connected with the access elements. The discharge unit may be connected with a bit line. The discharge unit may be configured to discharge a voltage of the bit line to a ground terminal in response to a signal of the source line. The discharge unit may include a phase changeable material.

10 Claims, 5 Drawing Sheets

PHASE CHANGEABLE MEMORY DEVICE HAVING A CROSS POINT ARRAY STRUCTURE

CROSS-REFERENCES TO RELATED APPLICATION

The present application claims priority under 35 U.S.C. § 119(a) to Korean application number 10-2016-0148398, filed on Nov. 8, 2016, in the Korean Intellectual Property Office, which is incorporated herein by reference in its entirety.

BACKGROUND

1. Technical Field

Various embodiments generally relate to a phase changeable memory device, more particularly, to a phase changeable memory device having a cross point array structure.

2. Related Art

Recently, chalcogenide materials have been used as a selection element such as a phase changeable memory layer, an Ovonic threshold switch (OTS) unit, etc. The OTS element and the phase changeable memory layer may be positioned at a cross point between a word line and a bit line to form a memory cell. This memory cell array may be referred to as a cross point array.

A phase changeable memory device having a cross point array structure may be configured to supply a uniform current through the bit line so as to perform accurate read and write operations. A current may be supplied to perform the read and write operations, a disturbance may have influence on a non-selected bit line. Further, an abnormal over-current may be applied through the bit line so that the memory cell may be broken.

SUMMARY

According to an embodiment, there may be provided a phase changeable memory device. The phase changeable memory device may include a plurality of word lines, a plurality of bit lines, a memory cell, a plurality of source lines, and a plurality of discharge units. The bit lines may cross with the word lines. The memory cell may include access elements connected with at least one source line. The access elements may include a phase changeable material. The discharge unit may be connected with a bit line. The discharge unit may be configured to discharge a voltage of the bit line to a ground terminal in response to a signal of the source line. The discharge unit may include a phase changeable material.

According to an embodiment, there may be provided a phase changeable memory device. The phase changeable memory device may include a bit line, a plurality of word lines, a plurality of memory cells, a source line, and a discharge unit. The word lines may cross the bit line. The memory cells may be arranged between the word lines and the bit line. The source line may be electrically connected with each of the memory cells. The discharge unit may be coupled to the bit line. The discharge unit may be configured to form a discharge path between the bit line and a ground terminal based on a voltage or a current of the source line.

DETAILED DESCRIPTION

Figure 1:
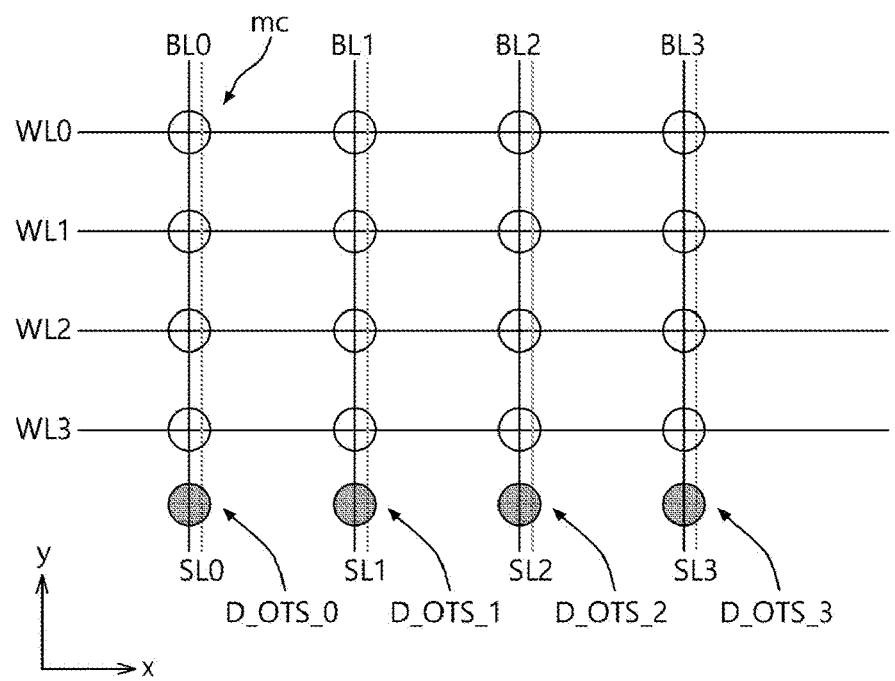
FIG. 1 is a plan view illustrating a phase changeable memory cell array in accordance with example embodiments.

Various example embodiments will be described hereinafter with reference to the accompanying drawings, in which some examples of the embodiments are illustrated. The embodiments may, however, be embodied in many different forms and should not be construed as limited to the example embodiments set forth herein. Rather, these example embodiments are provided so that this disclosure will be thorough and complete, and will fully convey a scope of the present disclosure to those skilled in the art. In the drawings, the sizes and relative sizes of layers and regions may be exaggerated for clarity.

Hereinafter, examples of the embodiments will be explained with reference to the accompanying drawings.

FIG. 1 is a plan view illustrating a phase changeable memory cell array in accordance with example embodiments.

Referring to FIG. 1, a phase changeable memory device 100 may include a plurality of word lines WL0-WL3, a plurality of bit lines BL0-BL3, and a plurality of source lines SL0-SL3.

The word lines WL0-WL3 may be parallel to each other and extended in an x-direction.

The bit lines BL0-BL3 may be extended in a y-direction substantially perpendicular to the x-direction. Thus, the bit lines BL0-BL3 may cross the word lines WL0-WL3, respectively. For example, the bit lines BL0-BL3 may be positioned over the word lines WL0-WL3.

The source lines SL0-SL3 may be extended parallel to the bit lines BL0-BL3. For example, the source lines SL0-SL3 may overlap with the bit lines BL0-BL3, respectively. For example, the source lines SL0-SL3 may be positioned under the bit lines BL0-BL3, respectively. Alternatively, the source lines SL0-SL3 may be connected in common.

Phase changeable memory cells MC may be electrically coupled between the word lines WL0-WL3 and the bit lines BL0-BL3, respectively. For example, the phase changeable memory cells MC may be electrically coupled among the word lines WL0-WL3, the bit lines BL0-BL3, and the source lines SL0-SL3, respectively. For example, the phase changeable memory cells MC may be positioned at intersection points between the word lines WL0-WL3 and the bit lines BL0-BL3. The phase changeable memory cells MC may include an access element corresponding to a selector and a memory element corresponding to a storage unit.

Figure 2:
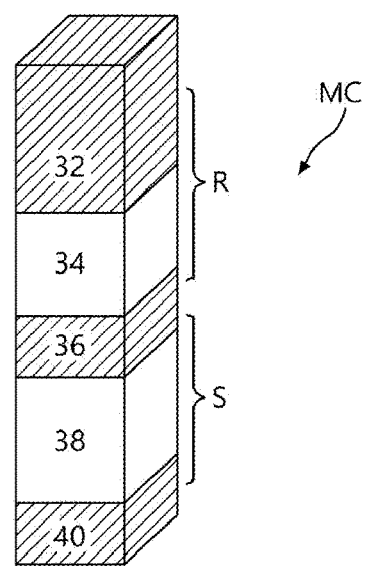
FIG. 2 is a perspective view illustrating a unit phase change memory cell in accordance with example embodiments.

FIG. 2 is a perspective view illustrating a unit phase change memory cell in accordance with example embodiments.

Referring to FIG. 2, the phase changeable memory cell MC may include a first electrode 32, a storage unit 34, a middle electrode 36, a selector 38, and a second electrode 40. The storage unit 34 may be formed under the first electrode 32. The middle electrode 36 may be formed under the storage unit 34. The selector 38 may be formed under the middle electrode 36. The second electrode 40 may be positioned between the selector 38 and the word line WL.

At least one of the storage unit 34 and the selector 38 may include a chalcogenide material. When the storage unit 34 and the selector 38 include the chalcogenide material, the chalcogenide material of the storage unit 34 may be phase-changed at a room temperature. The chalcogenide material of the selector 38 may have phase changeable characteristics different from those of the chalcogenide material in the storage unit 34. The position of the selector 38 and the storage unit 34 may be reversed.

The chalcogenide material of the storage unit 34 may include elements in an In—Sb—Te (IST) alloy, for example, an alloy including at least two of $In_2Sb_2Te_5$, $In_1Sb_2Te_4$, and $In_1Sb_4Te_7$, elements in a Ge—Sb—Te (GST) alloy, for example, an alloy including at least two of $Ge_8Sb_5Te_8$, $Ge_2Sb_2Te_5$, $Ge_1Sb_2Te_4$, $Ge_1Sb_4Te_7$, and $Ge_4Sb_4Te_7$, etc., at least two of $In_2Sb_2Te_5$, $In_1Sb_2Te_4$, and $In_1Sb_4Te_7$, elements in a Ge—Sb—Te (GST) alloy, for example, an alloy including at least two of $Ge_8Sb_5Te_8$, $Ge_2Sb_2Te_5$, $Ge_1Sb_2Te_4$, $Ge_1Sb_4Te_7$, and $Ge_4Sb_4Te_7$, etc. The chalcogenide material of the storage unit 34 may include Ge—Te, In—Se, Sb—Te, Ga—Sb, In—Sb, As—Te, Al—Te, In—Ge—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, Ge—Te—Sn—Pt, etc.

The middle electrode 36 may correspond to a node configured to electrically connect the storage unit 34 with the selector 38. In other words, the middle electrode 36 is shared by the storage unit 34 and the selector 38. For example, the middle electrode 36 may be coupled to one of the source lines SL0-SL3. Alternatively, the middle electrode 36 may be used as a heating electrode for heating the storage unit 34. The first electrode 32 may include an upper electrode or a contact portion.

The selector 38 may include an OTS (Ovonic threshold switch) element with a chalcogenide material or alloy which may also be used for the storage unit 34. The selector 38 may further include an element for suppressing a crystallization such as As. The element such as As may prohibit formations and or growth of a nucleus in the alloy to suppress crystallization. Thus, when a voltage of no less than a critical voltage is applied to the selector 38, the selector 38 may be switched into a conductive state. A sufficient holding current may be provided to the selector 38 during the conductive state. The selector 38 may include Te—As—Ge—Si, Ge—Te—Pb, Ge—Se—Te, Al—As—Te, Se—As—Ge—C, Se—Te—Ge—Si, Ge—Sb—Te—Se, Ge—Bi—Te—Se, Ge—As—Sb—Se, Ge—As—Bi—Te, Ge—As—Bi—Se, etc. The selector 38 may be electrically coupled to one of the word lines WL0-WL3. The second electrode 40 may be electrically coupled to one of the source lines SL0-SL3. The second electrode 40 may be used as a heating electrode for the phase change of the selector 38.

The first electrode 32, the storage unit 34, and the middle electrode 36 may correspond to a phase changeable memory resistor R of the phase changeable memory cell MC. The phase changeable memory resistor R may be electrically coupled with one of bit line BL0-BL3. The middle electrode 36, the selector 38, and the second electrode 40 may form an access device or access element S of the phase changeable memory cell MC.

Referring again to FIG. 1, discharge units D_OTS_0-D_OTS_3 may be connected to an end of the bit lines BL0-BL3, respectively. The discharge units D_OTS_0-D_OTS_3 may be connected between the bit lines BL0-BL3 and the source lines SL0-SL3, respectively. The discharge units D_OTS_0-D_OTS_3 may have configurations substantially the same as those of the OTS element in the phase changeable memory cell. The discharge units D_OTS_0-D_OTS_3 may include a phase changeable material such as, for example, a chalcogenide material.

Figure 3:
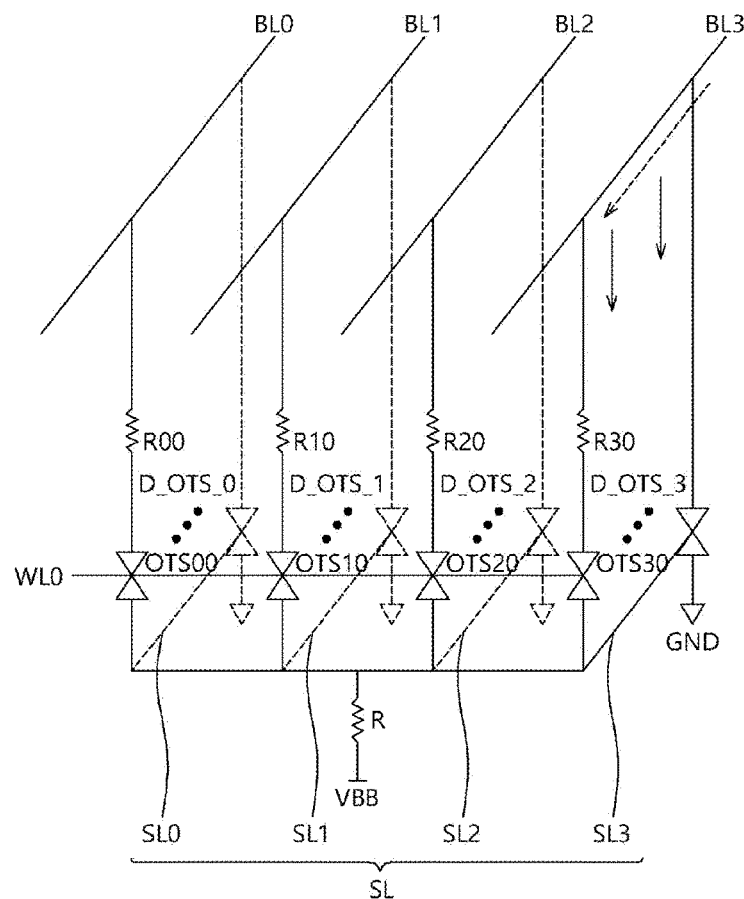
FIG. 3 is a circuit diagram illustrating a phase changeable memory cell array viewed from a side surface of one word line in accordance with example embodiments.

FIG. 3 is a circuit diagram illustrating a phase changeable memory cell array viewed from a side surface of one word line in accordance with example embodiments. FIG. 3 shows a cross point memory array structure including the discharge units D_OTS 0-D_OTS 3 connected between the bit lines BL0-BL3 and the source lines SL0-SL3, respectively.

Referring to FIG. 3, OTS elements OTS00-OTS30 as the access element and phase changeable memory resistors R00-R30 as the storage unit may be connected through the intersection points between the word line WL0 and the bit lines BL0-BL3. The OTS elements OTS00-OTS30 may be driven when the word line WL0 is enabled. The phase changeable memory resistors R00-R30 may read/write data in accordance with currents of the bit lines BL0-BL3.

The OTS elements OTS00-OTS30 may be configured to be electrically coupled with the phase changeable memory resistors R00-R30 to selectively transmit the currents of the bit lines BL0-BL3 to the phase changeable memory resistors R00-R30 in response to a signal (voltage) of the word line WL0.

Figure 6:
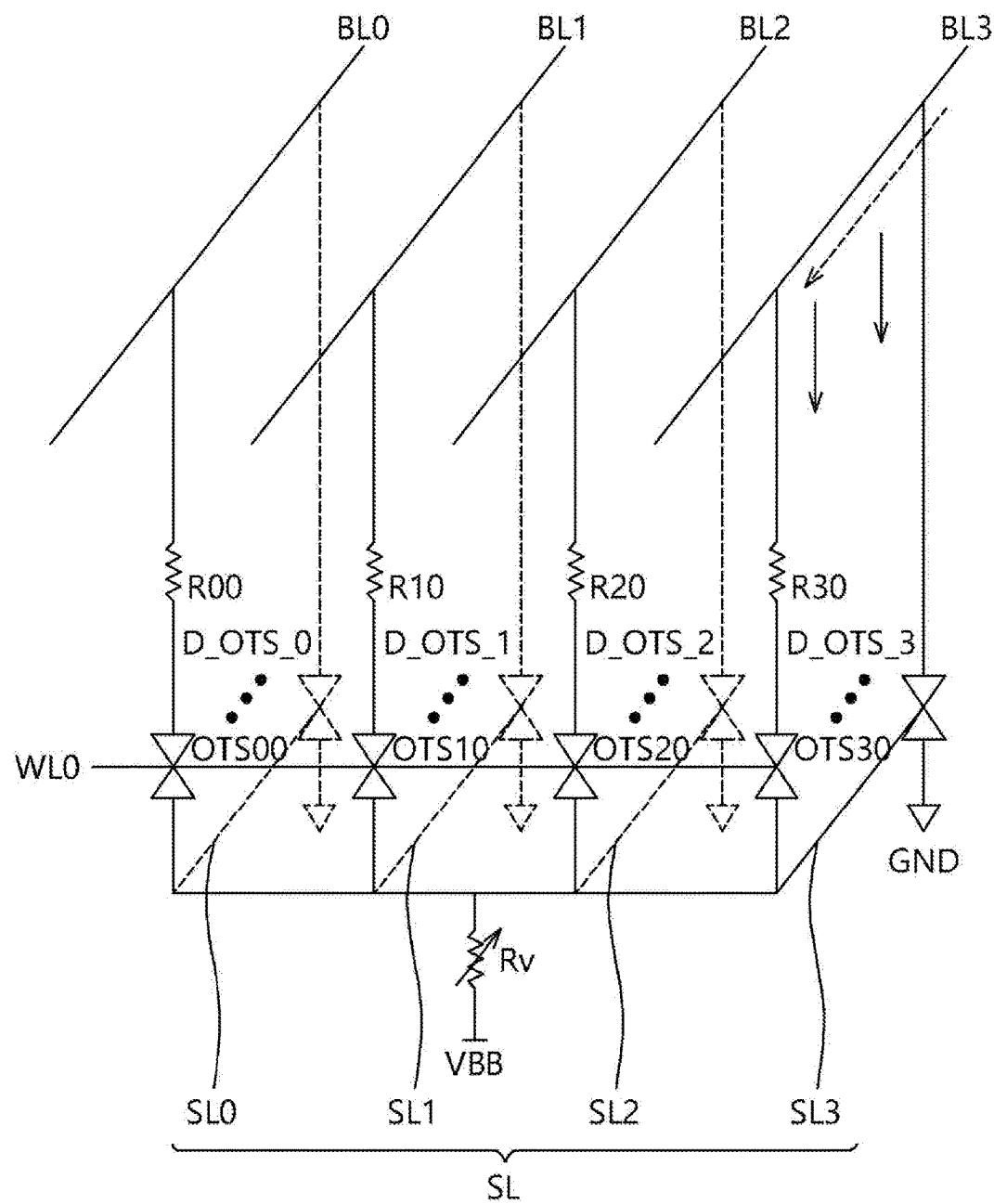
FIG. 6 is a circuit diagram illustrating a phase changeable memory cell array in accordance with example embodiments.

The source lines SL0-SL3 may be electrically coupled to a bulk bias terminal VBB, respectively. For example, the source lines SL0-SL3 may be electrically connected in common. A voltage stabilizing resistor Rs may be connected between the source line SL and the bulk bias terminal VBB. As shown in FIG. 6, the voltage stabilizing resistor may be used as a variable resistor Rv.

The discharge units D_OTS_0-D_OTS_3 may be electrically connected to one of the bit lines BL0-BL3. For example, the discharge units D_OTS_0-D_OTS_3 may be positioned at one end of the bit line BL0-BL3. The discharge units D_OTS_0-D_OTS_3 may be driven in response to a current provided to the source lines SL0-SL3.

Figure 4:
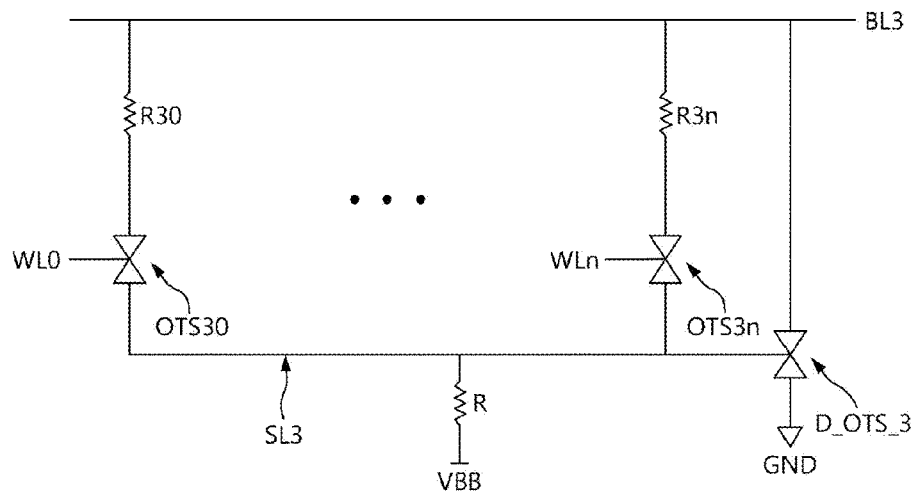
FIG. 4 is a circuit diagram illustrating a phase changeable memory cell array viewed from a side surface of one bit line in accordance with example embodiments.

FIG. 4 is a circuit diagram illustrating a phase changeable memory cell array viewed from a direction being perpendicular with one bit line (for example, BL3) in accordance with example embodiments.

Referring to FIG. 4, the word lines WL0-WLn may cross any one BL3 of the bit lines BL0-BL3. The phase changeable memory resistors R30-R3$n$ and the OTS elements OTS30-OTS3$n$ may be connected between the bit line BL3 and the word lines WL0-WLn. Particularly, the OTS elements OTS30-OTS3$n$ may be electrically coupled to each other between the phase changeable memory resistors R30-R3$n$ and the source line SL3. The OTS elements OTS30-OTS3$n$ may be turned-on in response to signals of the word lines WL0-WLn, respectively.

The discharge unit D_OTS_3 may be electrically coupled to an end of the bit line BL3. The discharge unit D_OTS_3 may include a switch being substantially the same as the OTS element used as the access element of the memory cell MC. Further, the OTS elements OTS30-OTS3$n$ may also be the same type of switch. The discharge unit D_OTS_3 may be driven in response to the source line SL3 extended parallel to the bit line BL3. Thus, when the source line SL3 is charged with a preset voltage, the discharge unit D_OTS_3 may discharge the voltage of the bit line to a ground terminal GND in response to a signal of the source line SL3. Accordingly, a discharge unit (for example, D_OTS_3) may be electrically coupled to a bit line (for example, BL3) to form a discharge path between the bit line BL3 and the ground terminal GND based on a voltage or current of a source line (for example, SL3). Further, a discharge unit D_OTS (for example, D_OTS_3) may be configured to be enabled in response to the voltage or current of a source line (for example, SL3).

Figure 5A:
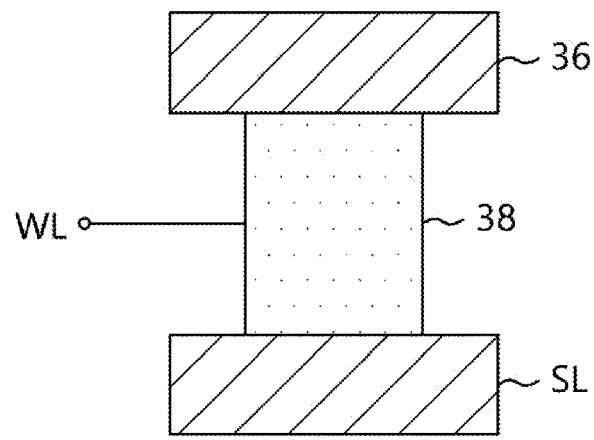
FIG. 5A is a cross-sectional view illustrating a three terminal type OTS element in accordance with example embodiments.
Figure 5B:
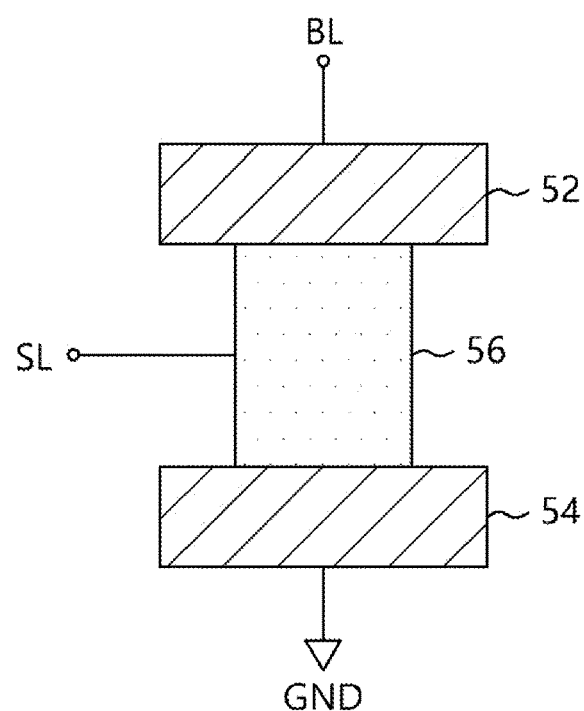
FIG. 5B is cross-sectional view illustrating a three terminal type OTS element as a discharge unit in accordance with example embodiments.

FIG. 5A is a cross-sectional view illustrating a three terminal type OTS element as an access element in accordance with example embodiments. FIG. 5B is cross-sectional view illustrating a three terminal type OTS element as a discharge unit in accordance with example embodiments.

As shown in FIG. 5A, the three terminal type OTS element may include a middle electrode 36, the selector 38 including the phase changeable layer and a source line SL, as a second electrode. The word line WL may be electrically coupled to the selector 38.

As shown in FIG. 5B, the discharge unit D_OTS may include an first electrode 52 electrically coupled to the bit lines BL, a second electrode 54 electrically coupled to a ground terminal GND and a phase changeable layer 56 electrically coupled to the source lines SL where the phase changeable layer 56 is formed between the first electrode 52 and the second electrode 54.

Hereinafter, operations of the phase changeable memory device may be illustrated in detail with reference to FIGS. 3 to 5B.

When the phase changeable memory resistor R30 positioned between the word line WL0 and the bit line BL3 is read or written, a current for performing the read operation or the write operation may be applied to the bit line BL3.

The current may be transmitted to the source line SL3 through the phase changeable memory resistor R30 and the OTS element OTS30. When the current is abnormally higher than a threshold current for reading or writing data, a current amount transmitted to the source line SL3 may be increased. When the current transmitted to the source line SL3 provides a voltage of no less than a threshold voltage of the discharge unit D_OTS_3, the discharge unit D_OTS_3 may be turned-on. Thus, an additional current path (for example, a discharge path) may be generated between the bit line BL3 and the source line SD. In other words, the discharge unit D_OTS_3 may form a discharge path when an abnormal over current flows in the source line SL3. The current in the bit line BL3 may be distributed to the additional current path on which the discharge unit D_OTS_3 may be positioned to prevent the abnormal over current from flowing through the memory cell MC.

Figure 7:
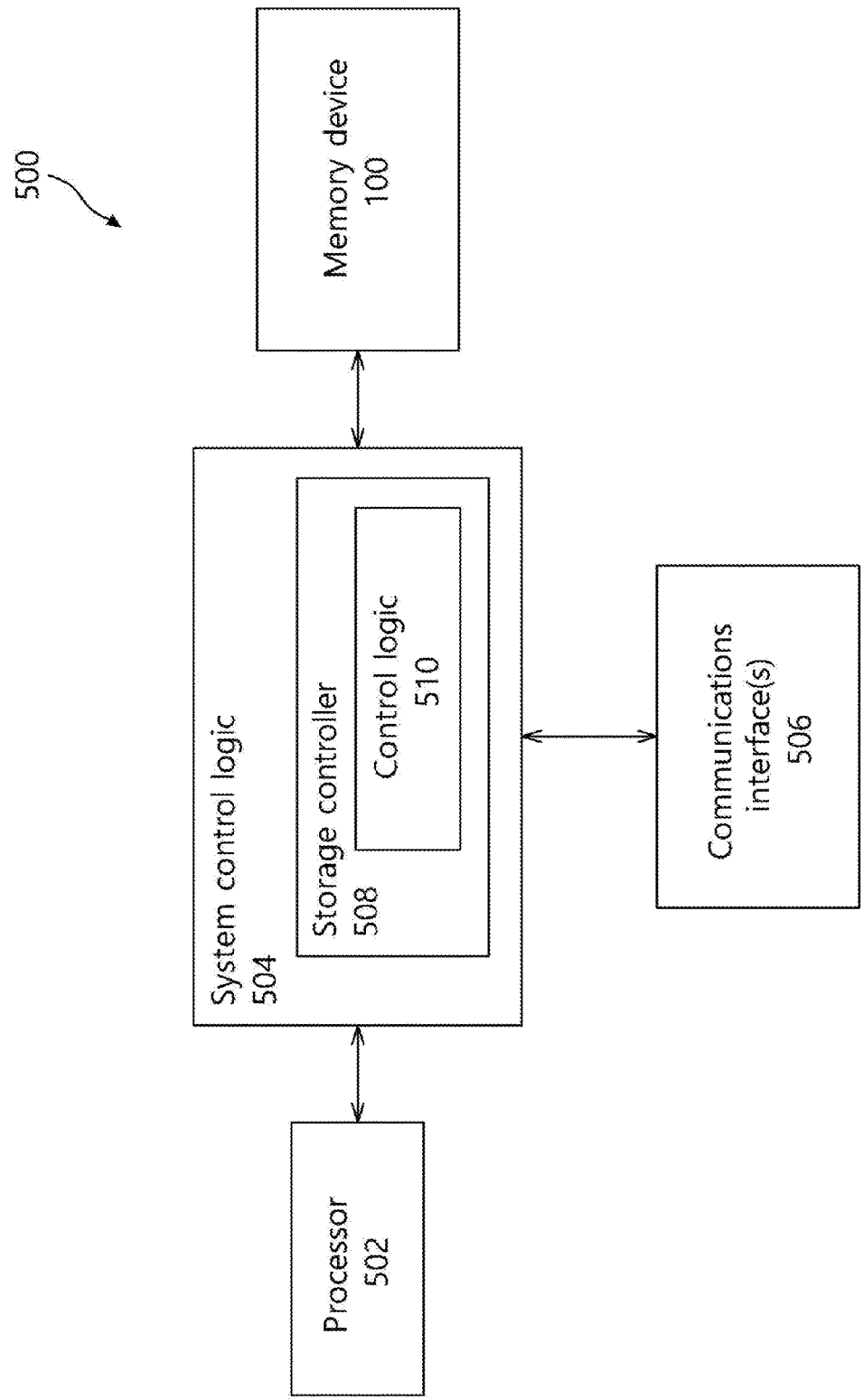
FIG. 7 is a block diagram illustrating a system in accordance with example embodiments.

FIG. 7 is a block diagram illustrating a system in accordance with example embodiments.

Referring to FIG. 7, a system 500 may include a system control logic 504, the phase changeable memory device or memory device 100 and at least one communication interface 506. The system control logic 504 may be connected with at least one of processors 502. The memory device 100 may be connected with the system control logic 504. The communication interface 506 may be connected with the system control logic 504.

The communication interface 506 may provide an interface for the system 500 configured to be communicated with devices through at least one network. The communication interface 506 may include a hardware and/or a firmware. In example embodiments, the communication interface 506 may include a network adaptor, a wireless network adaptor, a telephone modem and/or a wireless modem. The communication interface 506 may use at least one antenna for a wireless communication.

At least one of the processors 502 may be packed with a logic for at least one controller of the system control logic 504. In example embodiments, the processor 502 may be packed with the logic for the controller of the system control logic 504 to form a system in package (SIP).

In example embodiments, at least one of the processors 502 may be arranged on a die in which the logic for the controller of the system control logic may be installed.

In example embodiments, at least one of the processors 502 may be arranged on the die in which the logic for the controller of the system control logic may be installed to form a system on chip (SOC).

In example embodiments, the system control logic 504 may include interface controllers configured to provide a device or a component communicated with at least one of the processors 502 and/or the system control logic 504 with interfaces.

In example embodiments, the system control logic 504 may include a storage controller 508 configured to provide the memory device 100 with interfaces for controlling various access operations such as a set operation, a reset operation, a read operation, etc. The storage controller 508 may include a control logic 510 configured to control the memory device 100. The control logic 510 may additionally generate various selection signals for controlling drivers, level shifters, global selectors, etc. When the control logic 510 may be operated by at least one of the processors 502, the control logic 510 may include commands stored in a computer readable medium for performing the above-mentioned operations of the storage controller 508.

In example embodiments, the system 500 may include a desktop computing device, laptop computing device, a mobile computing device such as a smart phone, a tablet, etc. The system 500 may further include components and/or different architectures.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A phase changeable memory device comprising:
a plurality of word lines;
a plurality of bit lines arranged to cross the word lines;

a plurality of memory cells electrically coupled between the word lines and the bit lines, respectively, each of the memory cells including an access element and a storage unit;

a plurality of source lines electrically connected with the memory cells, respectively; and a plurality of discharge units electrically coupled to the bit lines to discharge a voltage of the bit lines to a ground terminal, each of the discharge units configured to be enabled in response to a current of a corresponding source line, which is provided from a corresponding bit line through a corresponding memory cell, and each of the discharge units including a phase changeable material.

2. The phase changeable memory device of claim 1, wherein the memory cells are electrically coupled to each other between the word lines and the bit lines, respectively.

3. The phase changeable memory device of claim 2, wherein the access element is configured to be electrically coupled with the storage unit and the memory cell is configured to transmit the current provided from the bit line to the source line in response to a signal of the word line.

4. The phase changeable memory device of claim 1, further comprising an electrode shared by the storage unit and the access element.

5. The phase changeable memory device of claim 1, wherein the access element comprises an Ovonic threshold switch (OTS) with a chalcogenide material.

6. The phase changeable memory device of claim 1, wherein the storage unit includes a phase changeable memory resistor with a chalcogenide material.

7. The phase changeable memory device of claim 6, wherein the phase changeable memory resistor is configured to write data according to currents in the plurality of bit lines.

8. The phase changeable memory device of claim 1, wherein the discharge unit comprises an OTS element including a chalcogenide material.

9. A phase changeable memory device comprising:

a plurality of word lines;

a plurality of bit lines arranged to cross the word lines;

a plurality of memory cells positioned between the word lines and the bit lines, respectively;

a common source line electrically coupled the plurality of the memory cells in common; and a plurality of discharge units electrically coupled to the bit lines to discharge a voltage of the bit lines to a ground terminal in response to a current or a voltage of the common source line, wherein each of the discharge units is configured to be driven when the current or the voltage of the source line, which is transmit from the bit line through a selected memory cell, is higher than a threshold current or a threshold voltage of the discharge unit.

10. The phase changeable memory device of claim 9, wherein each of the memory cells includes a first access element and a storage element connected to the first access element, each of the discharge unit includes a second access element, and the first and second access elements include an Ovonic threshold switch (OTS) with a chalcogenide material.

* * * * *